United States Patent [19]
Sweeney et al.

[11] Patent Number: 5,935,283
[45] Date of Patent: *Aug. 10, 1999

[54] CLOG-RESISTANT ENTRY STRUCTURE FOR INTRODUCING A PARTICULATE SOLIDS-CONTAINING AND/OR SOLIDS-FORMING GAS STREAM TO A GAS PROCESSING SYSTEM

[75] Inventors: Joseph D. Sweeney, San Francisco, Calif.; Prakash V. Arya, Cranston, R.I.; Mark Holst, Concord, Calif.; Scott Lane, Chandler, Ariz.

[73] Assignee: ATMI Ecosys Corporation, San Jose, Calif.

[*] Notice: This patent is subject to a terminal disclaimer.

[21] Appl. No.: 08/857,448

[22] Filed: May 16, 1997

Related U.S. Application Data

[63] Continuation-in-part of application No. 08/778,386, Dec. 31, 1996, Pat. No. 5,846,275.

[51] Int. Cl.$^6$ .......................... B01D 35/00; B01D 51/00; B65G 53/18
[52] U.S. Cl. .................. 55/431; 55/522; 55/523; 96/262; 96/326; 96/327; 96/355; 96/372; 261/112.1; 406/46; 406/48; 406/193
[58] Field of Search .............................. 55/431, 466, 522, 55/523, DIG. 32; 95/279, 280, 281; 96/228, 262, 267, 272, 274, 296, 298, 300, 326, 327, 355, 372, 379; 261/112.1; 406/46, 47, 48, 89, 172, 193

[56] References Cited

U.S. PATENT DOCUMENTS

| | | | |
|---|---|---|---|
| 3,888,955 | 6/1975 | Maruko | 261/99 |
| 3,918,917 | 11/1975 | Ashina et al. | 261/112.1 |
| 4,054,424 | 10/1977 | Staudinger et al. | 261/79.2 |
| 4,083,607 | 4/1978 | Mott | 55/DIG. 32 |
| 4,172,708 | 10/1979 | Wu et al. | 261/79.2 |
| 4,479,809 | 10/1984 | Johnson et al. | 55/340 |
| 5,252,007 | 10/1993 | Klinzing et al. | 406/89 |
| 5,846,275 | 12/1998 | Lane et al. | 55/431 |

Primary Examiner—C. Scott Bushey
Attorney, Agent, or Firm—Steven J. Hultquist; Oliver A.M. Zitzmann

[57] ABSTRACT

A clog-resistant inlet structure for introducing a particulate solids-containing and/or solids-Forming gas stream to a gas processing system. The structure is composed of a gas-permeable wall enclosing a gas flow path, and an outer annular jacket circumscribing the gas-permeable wall to define an annular gas reservoir therebetween. The clog-resistant inlet structure is constructed, arranged, and operated so as to introduce a gas into the annular gas reservoir during the flow of the particulate solids-containing and/or solids-forming gas stream to a gas processing system through such inlet structure at a pressure sufficient to combat the deposition or formation of solids on the interior surface of the gas-permeable wall. The inlet structure may further optionally include a downstream annular section in which the wall surface bounding the gas stream is blanketed with a falling liquid film, to combat solids deposition or formation on the blanketed wall surface.

19 Claims, 4 Drawing Sheets

CLOG-RESISTANT ENTRY STRUCTURE FOR INTRODUCING A PARTICULATE SOLIDS-CONTAINING AND/OR SOLIDS-FORMING GAS STREAM TO A GAS PROCESSING SYSTEM

CROSS-REFERENCE TO RELATED APPLICATIONS

This is a continuation-in-part of U.S. patent application Ser. No. 08/778,386 filed Dec. 31, 1996 now U.S. Pat. No. 5,846,275.

BACKGROUND OF THE INVENTION

1. Field of the Invention

This invention relates to a clogging-resistant entry structure for introducing a particulate solids-containing and/or solids-forming gas stream to a gas processing system.

2. Description of the Related Art

In the processing of particulate solids-containing and/or solids-forming gas streams for treatment thereof, clogging of inlet structures of process equipment with particulate solids from such streams is frequently a problem. As the particulate solids-containing and/or solids-forming gas stream is flowed through the process equipment, solids may be deposited on the surfaces and in the passages of the inlet structure.

In general, particulates associated with the gas stream can come from various sources, including: (i) particulate generated in an upstream process unit which comes downstream to the inlet structure with the gas stream; (ii) particulate formed in the system lines by the reaction of a process gas component with oxygen from leaks coming into the lines; (iii) particulate formed in the system lines due to reaction of two or more process off-gases during flow of the gas stream coming downstream to the inlet structure; (iv) particulate formed by (partial) condensation of off-gases coming downstream to the inlet structure; and (v) particulate formed by reaction of process gases with back-diffusing oxygen or water vapor from a downstream gas stream treatment unit such as for example a downstream water scrubber. In some instances, where the particulate is formed by condensation, it may be possible to ameliorate the problem by heating of process lines, to eliminate the condensable portion of the gas stream. Even with such line heating, however, the problems of particulate from other sources still remain.

Particularly in the field of semiconductor manufacture, inlet clogging is prone to occur from: (a) back-migration to the inlet of water vapor, or liquid water via capillary action, as a combustion product of downstream oxidation operations and/or water scrubbing operations employed to treat the gas stream, causing hydrolysis reactions in a heterogeneous or homogeneous fashion with incoming water-sensitive gases such as $BCl_3$, $WF_6$, DCS, TCS, $SiF_4$; (b) thermal degradation of incoming thermally-sensitive gases; and (c) condensation of incoming gases due to transition points in the system.

The aforementioned inlet clogging problems may require the incorporation of plunger mechanisms or other solids removal means to keep the inlet free of solids accumulations, however these mechanical fixes add considerable expense and labor to the system and may damage the entry over time. In other instances, the inlet clogging problems may be systemic and require periodic preventative maintenance to keep the inlet free of solids accumulations. Such maintenance, however, requires shut-down of the system and loss of productivity in the manufacturing or process facility with which the inlet is associated.

Considering specifically the occurrence of water vapor, or liquid water via capillary action, backstreaming from a downstream water scrubber to an upstream inlet structure in a semiconductor process effluent gas stream treatment system, wherein water vapor released from the scrubber migrates back from the scrubber inlet toward the process tool, against the normal direction of process gas flow, various mechanisms may be involved in the transport of the back-migration of the water vapor.

One mechanism is gas-gas interdiffusion. The only practical way of avoiding this source of water vapor back migration is to add a diffusion boundary to the water scrubber inlet.

Another mechanism for such back-diffusion of water vapor is the so-called Richardson effect annular effect. All dry pumps create a certain amount of pressure oscillation in the gas flow stream. These pressure oscillations create a counterflow transport mechanism that pumps gases against the direction of normal gas flow. This phenomenon is a consequence of the boundary layer annular effect. Because of this effect, the backflow migration velocity is greatest a small distance away from the wall surface.

If particulate solids continue to accumulate with continued operation of process equipment, the inlet structure of such equipment may become occluded to sufficient extent as to plug entirely, or alternatively the solids build-up may not occlude the inlet of the process unit, but may so impair the flows and increase the pressure drop in the system as to render the process equipment grossly inefficient for its intended purpose.

Particularly in the case of water scrubber equipment used for scrubbing of gas streams such as waste gas streams generated in the manufacture of semiconductor devices, the waste gas constituting the influent gas stream to the water scrubber may contain or produce (by reaction or condensation) significant fine particles content, e.g., submicron particles of silica, metals from CVD or other deposition operations, etc. Such waste gas streams tend to clog the inlet of the waste gas water scrubber very readily. As a result the inlet of the water scrubber requires manual cleaning on a frequent basis.

The inlet clogging susceptibility is a major shortcoming of current commercial water scrubber units used in the semiconductor industry. The time required to clog the entry of the water scrubber in such applications is process dependent and site-specific. Among the factors that affect the mean time to failure of the water scrubber due to the clogging of the inlet include: the process tool generating the particulates-containing process effluent stream being treated in the scrubber, the specific process recipes and chemistries employed in the upstream process generating the effluent being treated in the water scrubber, and the character of the inert gas purges used to purge pumps and process lines in the system. Other process conditions and factors are suspected of contributing to or affecting particle build-up in the process system, but are not yet clearly defined. See Abreu, R., Troup, A. and Sahm, M., "Causes of anomalous solid formation in the exhaust systems of low-pressure chemical vapor deposition and plasma enhanced chemical vapor deposition semiconductor processes, J. Vac. Sci. Technol. B 12 (4), July/August 1994, 2763–2767.

It would therefore be a significant advance in the field and is accordingly an object of the present invention to provide an improved inlet structure for a process unit, such as a water scrubber unit, which is resistant to clogging.

It is another object of the present invention to provide such an inlet structure which in addition to being highly resistant to clogging by particulate solids is readily removable from the process equipment with which it is employed, for cleaning purposes.

It is a still further object of the present invention to provide such an inlet structure which is significantly self-cleaning in character.

Other objects and advantages of the invention will be more fully apparent from the ensuing disclosure and appended claims.

SUMMARY OF THE INVETION

In a broad aspect, the present invention relates to a clog-resistant inlet structure for introducing a particulate solids-containing and/or solids-forming gas stream to a gas processing system.

The inlet structure may for example comprise a gas-permeable wall enclosing a gas flow path, and an outer annular jacket circumscribing the gas-permeable wall to define an annular gas reservoir therebetween. The outer annular jacket is provided with means for introducing a gas into the annular gas reservoir during the flow of the particulate solids-containing and/or solids-forming gas stream to a gas processing system through such inlet structure, e.g., a port in the jacket for attachment of a pressurized gas source vessel such as a conventional pressurized gas cylinder. In such structure, the gas supplied to the annular gas reservoir is at sufficiently pressurized to "bleed" through the gas-permeable wall for the purpose of combatting the deposition or formation of solids on the interior surface of the gas-permeable wall.

As a further variant, the inlet structure described above may further optionally comprise a port for introducing a pulsed higher pressure gas into the annular reservoir, with the port being coupled with a source of higher pressure gas and means for pulsed delivery thereof from the source to the annular reservoir. In operation, such pulsed higher pressure gas introduction effects additional anti-clogging action on the gas-permeable wall, with the pulsatility serving to dislodge particulates that may form or otherwise deposit on the inner surface of the gas-permeable wall even with the lower pressure gas being constantly permeated though the wall. The port on the outer annular jacket may be constructed and arranged to provide a tangential flow of higher pressure gas into the annular reservoir.

As yet another variant of the inlet structure broadly described above, the gas-permeable wall and outer annular jacket may optionally be coupled to a downstream flow path section including a wall enclosing a corresponding further section of the gas flow path and forming with the gas permeable wall a slot therebetween. The wall of the downstream flow path section is circumscribed by an outer annular jacket to define an annular liquid reservoir therebetween in liquid overflow relationship with the slot so that when the annular liquid reservoir is filled with water or other liquid beyond a certain point determined by the height of the wall, the liquid flows over the wall and down the interior surface of the wall, as a falling liquid film thereon. Such falling liquid film thus provides a barrier or blanketing medium on the wall interior surfaces, to resist solids deposition or formation on such interior surfaces, and also serves to wash away any solids which nonetheless are deposited or formed on the interior surface of the wall.

The outer annular jacket of the downstream flow path section of the inlet structure may be provided with a port or other ingress means, coupled to a source of liquid, e.g., a vessel containing such liquid by a line or conduit containing a flow control valve or other flow-regulating means.

The port elements in the above-described structures may comprise a unitary opening, channel, feed-through, nipple, or other ingress structure, and/or a multiplicity of same, e.g., a series of vertically and/or circumferentially spaced apart ingress structures through which the fluid in each case is transferred into the interior volume of the annular reservoir with which the ports are associated.

In another aspect, the inlet structure of the invention comprises first and second generally vertically arranged flow passage sections in serial coupled relationship to one another, defining in such serial coupled relationship a generally vertical flow passage through which the particulate solids-containing fluid stream and/or solids forming stream may be flowed, from an upstream source of the particulate solids-containing and/or solids forming fluid to a downstream fluid processing system arranged in fluid stream-receiving relationship to the inlet structure.

The first flow passage section is an upper section of the inlet structure and includes an inner gas-permeable wall which may be formed of a porous metal, porous ceramic, porous plastic, or other suitable material of construction, enclosing a first upper part of the flow passage. The porous inner wall has an interior surface bounding the upper part of the flow passage.

The gas-permeable wall is enclosingly surrounded by an outer wall in spaced apart relationship to the porous inner wall. The outer wall is not porous in character, but is provided with a gas flow port. By such arrangement, there is formed between the respective inner porous wall and outer enclosing wall an interior annular volume.

The gas flow port in turn may be coupled in flow relationship to a source of gas for flowing such gas at a predetermined low rate, e.g., by suitable valve and control means, into the interior annular volume, for subsequent flow of the gas from the interior annular volume into the flow passage. A high pressure gas flow port is also provided in the outer wall of the first flow passage section, coupled in flow relationship to a source of high pressure gas for intermittent flowing of such gas into the interior annular volume, such high pressure gas flow serving to clean the inner porous wall of any particulates that may have deposited on the inner surface thereof (bounding the flow passage in the first flow passage section). The high pressure gas may likewise be controllably flowed at the desired pressure by suitable valve and control means.

The second flow passage section is serially coupled to the first flow passage section, for flowing of particulate solids-containing fluid downwardly into the second flow passage section from the first flow passage section. The second flow passage includes an outer wall having a liquid injection port therein, which may be coupled with a source of liquid such as water or other process liquid. The outer wall is coupleable with the first flow passage section, such as by means of matable flanges on the respective outer walls of the first and second flow passage sections. The second flow passage includes an inner weir wall in spaced apart relationship to the outer wall to define an interior annular volume therebetween, with the inner weir wall extending toward but stopping short of the inner porous wall of the first flow passage section, to provide a gap between such respective inner walls of the first and second flow passage sections, defining a weir. When liquid is flowed into the interior annular volume between the outer wall of the second flow passage section and the inner wall thereof, the introduced liquid overflows the weir and flows down the interior surface of the inner wall of the second flow passage section. Such flow of liquid down the inner wall serves to wash any particulate solids from the wall and to suppress the deposition or formation of solids on the interior wall surface of the inner wall.

The flanged connection of the first and second flow passage sections with one another may include a quick-release clamp assembly, to accommodate ready disassembly of the respective first and second flow passage sections of the inlet structure.

Further, the first flow passage section of the inlet structure may be joined to an uppermost inlet structure quick-disconnect inlet section, which likewise may be readily disassembled for cleaning and maintenance purposes.

Other aspects, features and embodiments of the invention will be more fully appreciated from the ensuing disclosure and appended claims.

DETAILED DESCRIPTION OF THE INVENTION AND PREFERRED EMBODIMENTS THEREOF

The disclosure of U.S. patent application Ser. No. 08/778, 386 filed Dec. 31, 1996 is hereby incorporated herein by reference in its entirety.

Figure 1:
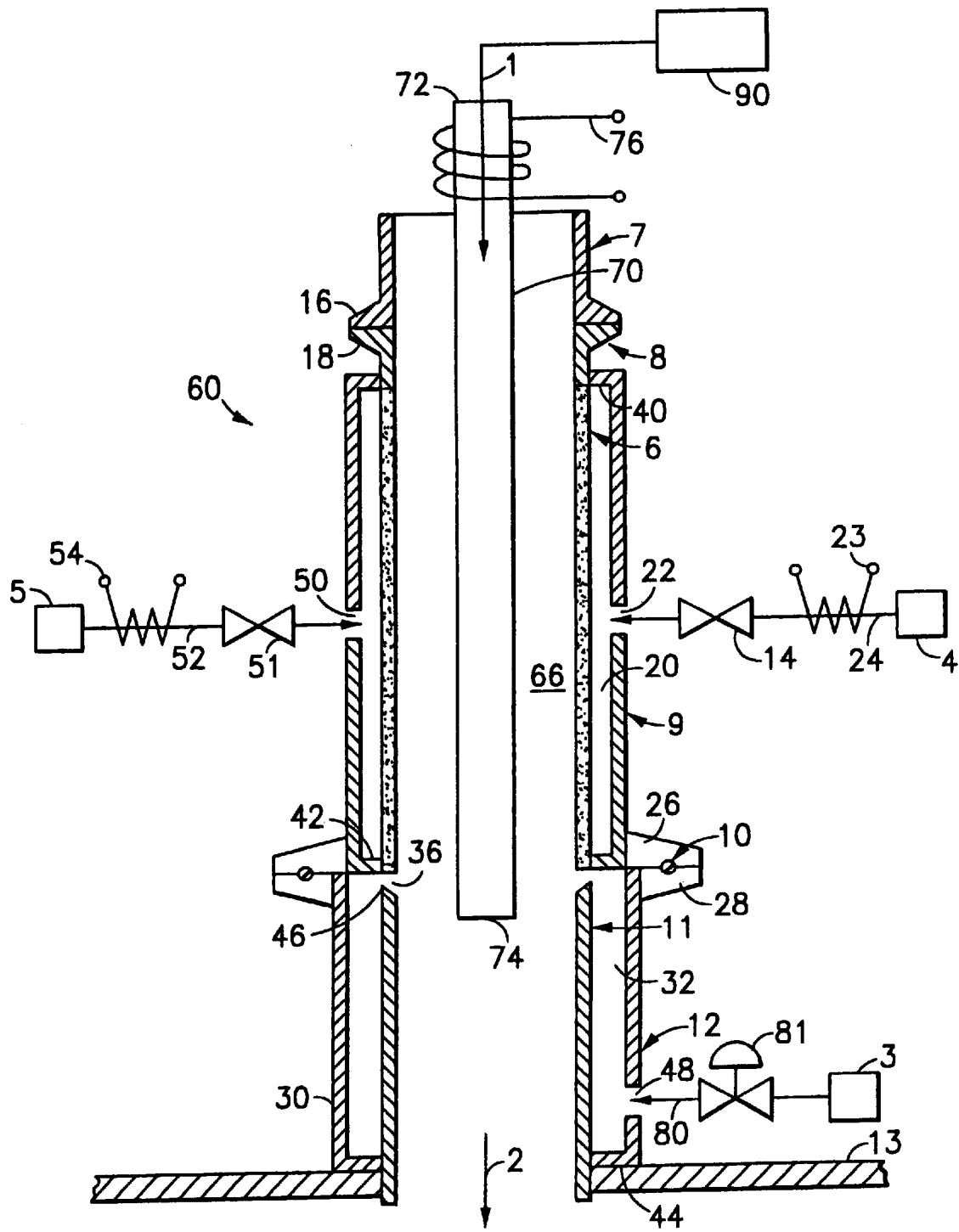
FIG. 1 is a schematic representation of a clogging-resistant inlet structure according to an illustrative embodiment of the present invention.

Referring now to the drawings, FIG. 1 is a schematic representation of a clogging-resistant inlet structure according to an illustrative embodiment of the present invention.

The inlet structure is shown in FIG. 1 as being connectable to process piping for coupling the inlet structure with a source of the gas stream being introduced to such inlet structure. Such upstream piping may be suitably heat-traced in a conventional manner, from the upstream source of the gas stream, e.g., a semiconductor manufacturing tool, to the inlet flange on the inlet structure as shown. The purpose of such heat-tracing is to add sufficient energy to the gas stream in the piping to prevent components of such gas stream from condensing or subliming in the inlet structure.

The inlet structure 60 shown in FIG. 1 comprises an inlet section 7 including an inlet flange 16. The inlet flange is matably engageable with the flange 18 of upper annular section 8 which terminates at its upper end in such flange. The inlet section may be coupled with an upstream particulate solids-containing and/or particulate solids-forming stream generating facility 90, as for example a semiconductor manufacturing tool.

The annular section 8 comprises an inner porous wall 6 which is of appropriate porosity to be gas-permeable in character, and an outer solid wall 9 defining an annular interior volume 20 therebetween. The interior surface of the inner porous wall 6 thus bounds the flow passage 66 in the upper annular section 8. The outer solid wall 9 at its upper and lower ends is enclosed in relation to the inner wall 6, by means of the end walls 40 and 42 to enclose the annular interior volume. The outer wall 9 is provided with a gas inlet port 22 to which is joined a gas feed line 24. The gas feed line 24 is connected at its outer end to a source 4 of gas. A check valve 14 is disposed in the gas feed line 24, to accommodate the flow of gas into the annular interior volume 20. The feed line 24 may also be provided with other flow control means (not shown) for selectively feeding the gas from the source 4 into the annular interior volume 20 in a desired amount and at a desired flow rate, in the operation of the system.

A means for heating gas feed line 24 may be included to elevate the temperature of the gas permeating the porous wall 6. A means for heating gas feed line 24 may include an electrical resistance heater, stream tracing lines, heating jackets, or any other heating systems that are known to the skilled artisan and useful for transferring thermal energy to the internal passages of gas feed line 24 to increase the temperature of the gas. For purposes of illustration, the heating means employed in the FIG. 1 embodiment are constituted by heating coils 23. A thermal jacket may also cooperate with the heating means to raise the internal temperature of gas line 24.

The upper annular section 8 may also be provided with an optional high pressure gas injection port 50 to which is joined high pressure gas feed line 52 joined in turn to high pressure gas supply 5. The gas feed line is shown with a flow control valve 51 therein, which may be joined to flow controller means (not shown) for operating the flow control valve 51 in accordance with a predetermined sequence. The high pressure gas feed line 52 alternatively may be disposed at any suitable angle in relation to the high pressure gas injection port 50, e.g., at an oblique angle.

The optional high pressure gas injection port 50 and high pressure gas feed line 52 are advantageous if solids accumulation occurs on the interior wall surface of the gas-permeable wall, despite the constant flux (or "bleed-through") of the lower pressure gas introduced in line 24 to the annular interior volume 20. A means for heating high pressure gas feed line 52 may be included to elevate the temperature of the gas. A means for heating gas feed line 52 may include an electrical resistance heater, stream tracing lines, heating jackets, or any other heating systems that are known to the skilled artisan and useful for transferring thermal energy to the internal passages of gas feed line 52 to increase the temperature of the gas. For purposes of illustration, the heating means employed in the FIG. 1 embodiment are constituted by heating coils 54. A thermal jacket may also cooperate with the heating means to raise the internal temperature of gas line 52.

The upper annular section 8 terminates at its lower end in a flange 26 which mates and engages with flange 28 of the lower annular section 30. The flanges 26 and 28 may be sealed by the provision of a sealing means such as the O-ring 10 shown in FIG. 1.

The lower annular section 30 includes an outer wall 12 terminating at its upper end in the flange 28. The outer wall is a jacket member which at its lower end is joined to the inner weir wall 11 by means of the end wall 44, to form an annular interior volume 32 between the outer wall 12 and the inner weir wall 11. The inner weir wall 11 extends vertically upwardly as shown but terminates at an upper end 46 in spaced relation to the lower end of inner porous wall 6 of upper annular section 8, so as to form a gap 36 therebetween defining an overflow weir for the lower annular section 30.

The outer wall 12 of the lower annular section 30 is provided with a water inlet port 48 to which may be joined a water feed line 80 joined to water supply 3 having liquid flow control valve 81 therein which may be operatively coupled with other flow control means for maintaining a desired flow rate of liquid to the lower annular section 30. Water inlet port 48 may be affixed to lower annular section 30 in a radial orientation or in a tangential orientation. A preferred embodiment of this invention places water inlet port 48 affixed to lower annular section 30 in a tangential orientation so that the water momentum jet introduced to the lower annular section is not directed against fixed walls, yet, rather dissipates itself by setting up a tangential swirl of the overflow water in the lower annular section. Tangential water introduction then optimizes the levelness of the water film overflowing the lower annulus section as momentum perturbations to the top level of the water film.

An extended gas stream delivery tube 70 may be used to introduce the particulate solids-containing and/or particulate solids-forming gas stream at a specific location of the inlet structure. Delivery tube 70 is coupled in gas-flow receiving relationship with upstream source 90 and directs and exhausts the gas stream to a suitable location within interior gas flow passage 66 to minimize the formation of solids within the inlet structure. The delivery tube 70 is circumscribed by outer solid wall 9 with inlet 7 modified to accommodate delivery tube 70. Delivery tube 70 may be heated to combat condensation of the gas stream flowing through tube 70.

In the inlet structure shown in FIG. 1, tube 70 is circumscribed by inner porous wall 6 and is coaxial with porous wall 6. An exterior surface of delivery tube 70 and interior surface of porous wall 6 define an annular volume therebetween. Gas delivery tube 70 includes a first end 72 coupled in gas flow receiving relationship with gas stream source 90 and a second end 74 exhausting the gas stream within gas flow passage 66. Second end 74 may exhaust the gas stream in gas flow passage 66 contained within upper annular section 8 or contained within lower annular section 30. In the embodiment shown, tube 70 exhausts the gas stream at a point about one-half inch below weir wall upper end 46, although tube 70 may extend further below weir wall upper end 46, or may terminate above weir wall upper end 46, depending upon the gas stream, process use, and conditions.

Delivery tube 70 may, for example, be constructed of stainless steel of approximately one-half to approximately four inches inner diameter. Those skilled in the art will recognize that tube 70 may be constructed of various materials, of various sizes, of various cross-sections, and of various configurations. The co-annular flow pattern, created by the placement of delivery tube 70 relative to porous wall 6 and overflow weir 11, serves to minimize mixing of process gas with water vapor from weir 11 as the process gas exits the delivery tube and enters region 66. Solids-forming reactions between the process gas exiting delivery tube 70 and water vapor from weir 11 are, therefore, dramatically minimized until a point sufficiently downstream such that the action of weir 11 can flush any solids into the downstream abatement device.

In order to determine the anti-clogging efficiency of a given inlet design within the scope of the present invention, a suitable assessment technique is to monitor the solids build-up quantity and location of the specific inlet structure after several minutes at a flow rate of 1–5 slpm of trichlorosilane at an average flow rate of nitrogen carrier gas, to determine the suitability of the design and the effects of any inlet structure parameter change. A longer observation period may be desired to monitor the nature of the solids growth. It may also be advantageous, depending upon the gas stream, process use, and conditions, to maintain laminar axial gas stream flow in the gas delivery tube and in the annular section between the gas delivery tube exterior and the porous wall interior to ensure adequate shrouding of the effluent stream and containing walls of the inlet.

Delivery tube 70 may also be heated to reduce condensation gases. Solids are formed on the walls of tube 70 by condensation of gases flowing through the tube. Suitable means for heating tube 70 may include an electrical resistance heater, stream tracing lines, heating jackets, etc., with such heating system being constructed and arranged for transferring thermal energy to the internal passages of the delivery tube 70 to combat condensation. For purposes of illustration, the heating means are shown as comprising heating coils 76. A thermal jacket may also cooperate with the heating means to raise the internal temperature of delivery tube 70. A thermal jacket may be employed to raise the side wall temperature to prevent condensable process gases from condensing in the tube.

At its lower end, the lower annular section 30 may be suitably joined to the housing of the water scrubber 13. The water scrubber may be constructed in a conventional manner for conducting scrubbing abatement of particulates and solubilizable components of the process stream. Alternatively, the inlet structure 60 may be coupled to any other processing equipment for treatment or processing of the gas stream passed through the inlet structure, from the inlet end to the discharge end thereof.

Thus, there is provided by the inlet structure 60 a gas flow path 66 through which influent gas may flow in the direction indicated by arrow "1" in FIG. 1 to the discharge end in the direction indicated by arrow "2" in FIG. 1.

In operation, particulate solids-containing gas is introduced from an upstream source, such as a semiconductor manufacturing tool (not shown) by means of suitable connecting piping, which as mentioned hereinabove may be heat-traced to suppress deleterious sublimation or condensation of gas stream components in the inlet structure. The stream enters the inlet structure 60 in the flow direction indicated by arrow "1" and passes through the inlet section 7 (or delivery tube 70, if installed) and enters the upper annular section 8. Gas, such as nitrogen, or other gas, is flowed from source 4 through gas feed line 24 connected to port 22, and enters the annular interior volume 20. From the annular interior volume 20 the introduced gas flows through the gas-permeable wall 6, into the interior gas flow passage 66. The particulate-containing or particulate forming gas thus flows through the interior gas flow passage 66 and into the water scrubber 13, as the gas from gas feed line 24 flows into the annular interior volume 20 and through the gas-permeable wall 6.

In this manner, the annular interior volume 20 is pressurized with the gas from the source 4. Such pressure ensures a steady flow of the gas through the porous wall into the interior gas flow passage 66. Such low flow rate, steady flow of the gas through the gas-permeable wall maintains the particulates in the gas stream flowing through the interior gas flow passage 66 away from the interior wall surfaces of the inlet structure. Further, any gases present with the gas flow stream in the interior flow passage 66 are likewise kept away from the interior wall surfaces of the inlet structure.

The gas feed line 24 can if desired be heat traced. Such heat tracing may be desirable if the gas stream flowing through the inlet structure contains species that may condense or sublimate and deposit on the walls of the inlet structure.

Concurrently, high pressure gas from high pressure gas supply 5 may be periodically flowed through high pressure gas feed line 52 through high pressure gas injection port 50 to the annular interior volume 20. For this purpose, the line 52 may have a flow control valve (not shown) therein, to accommodate the pulsed introduction of the high pressure gas. In this manner, the high pressure gas is injected into the annular interior volume at specified or predetermined intervals, in order to break away any particle buildup on the inner surface of the gas permeable wall 6. The duration and time sequencing of the pulsed introduction of the high pressure gas may be readily determined without undue experimentation within the skill of the art, to achieve the desired wall scouring effect which will prevent solids accumulation on the gas permeable wall surfaces. If required, when the inlet structure is employed in connection with a water scrubber servicing a semiconductor manufacturing tool, such high pressure gas injections may be interrupted during the tool batch cycle in order to eliminate pressure fluctuations at the tool exhaust port by suitable integration of control means operatively linked to the tool control system. For this purpose, a control valve such as a solenoid valve may be appropriately coupled with control means of the tool assembly.

In the inlet structure embodiment shown, the flanges 26 and 28 may be clamped to one another to permit quick disconnection of the upper annular section 8 from the lower annular section 30. For such purpose, a quick-disconnect clamp may be employed. The sealing gasket 10 between flanges 26 and 28 may be formed of a suitable material such as a corrosion resistant, high temperature elastomer material. This elastomeric gasket additionally functions as a thermal barrier to minimize heat transfer from the upper annular section to the lower annular section of the inlet structure, a feature which is particularly important in heat traced embodiments of the invention.

The gas permeable wall 6 of the upper annular section of the in let structure may be formed of any suitable gas-permeable material, e.g., ceramics, metals and metal alloys, and plastics. As a specific example, the wall may be formed of a Hastelloy 276 material, The outer wall 9 of the upper annular section may likewise be formed of any suitable material, and may for example be a thin walled stainless steel pipe.

The lower annular section 30 of the inlet structure may be formed of any suitable material such as a polyvinylchloride plastic. Water is injected into the annular interior volume 32 between the outer wall 12 and the inner weir wall 11 through line 50 from water supply 3. Preferably, the water is injected tangentially, to allow the angular momentum of the water in the annular interior volume 32 to cause the water to spiral over the top end 46 of the weir wall 11 and down the interior surface of the weir wall in the interior flow passage 66 of the inlet structure. Such water flow down the interior surface of the weir wall 11 is employed to wash any particulates down the flow passage 66 to the water scrubber 14 below the inlet structure. As mentioned, the lower annular section 30 is an optional structural feature which may be omitted, e.g., when the downstream process unit is a combustion scrubber.

The pressure drop through the inlet structure can be readily determined by pressure tapping the exhaust pipe from the upstream process unit and the scrubber unit downstream of the inlet structure. The pressure drop can be sensed with a Photohelic gauge or other suitable pressure sensing gauge and such pressure drop reading can be sent to suitable monitoring and control equipment to monitor clogging in the scrubber inlet.

By the use of the inlet structure in accordance with the present invention, an interface may be provided between the water scrubber and the tool exhaust stream from a semiconductor manufacturing operation, that does not clog repeatedly in normal process operation. The inlet structure of the present invention provides an interface with two ancillary process streams, a steady low flow purge stream and a high pressure pulse stream. The low flow purge stream creates a net flux of inert gas, e.g., nitrogen, away from the inner surface of the upper annular section toward the centerline of the central flow passage 66. The high pressure gas flow stream provides a self-cleaning capability against solids clogging. The high pressure gas flow is employed to eliminate any particle buildup on the inlet structure upper annular section interior surfaces of the central flow passage 66.

Gases, entrained particles, and previously deposited particles are then directed into the overflow stream at the inner wall surface in the lower annular section of the inlet structure, to be flushed down into the water scrubber downstream of the inlet structure. In this manner a direct interface between the gas permeable wall of the upper annular section and the weir wall of the lower annular section of the inlet structure, providing a highly efficient inlet conformation which effectively minimizes the buildup of particulate solids in operation.

The inlet structure of the invention has a number of advantages. In application to a semiconductor manufacturing facility and water scrubber treatment system for processing of waste gas effluents from a tool in the semiconductor process facility, the exhaust gas from the semiconductor tool can be heated continuously all the way from the tool exhaust port to the water interface in the water scrubber inlet structure. Heat tracing on the inlet lines can be used to heat the lines by conducting energy into the piping, which transfers energy to the flowing gas stream by forced convection. Process gas may be heated all the way down to the overflow weir wall of the lower annular section of the inlet structure by heat tracing the gas flow line which flows gas to the upper annular section, as well as by heat tracing the high pressure gas flow line feeding pulsed high pressure gas to the interior annular volume of the upper annular section of the inlet structure. Such flow of heated gas will maintain the process gas flowing through the central flow passage of the inlet structure at a temperature which is determined by the vapor pressure of any particulate forming gas in the gas stream flowing to the inlet structure from the upstream process unit that would otherwise condense or sublimate and deposit on the walls of the inlet structure.

Another advantage of the inlet structure of the present invention is that such structure may be readily disassembled. In the event that the inlet structure does clog in operation, the structure is easily taken apart by simply removing the clamps or other securement elements holding the flanges of the inlet structure to one another. The upper annular section may thus be replaced by removing the clamps holding the respective flanges in position, and by disconnecting the respective gas feed lines that feed the upper annular section.

A still further advantage of the inlet structure of the present invention is that it is self-cleaning in character. Particles that have been entrained in the gas stream flowing to the inlet structure from the upstream process unit or that have been formed by chemical reaction in the inlet structure can be readily cleaned from the gas-permeable wall of the inlet structure by the pulsed high pressure gas injection into the interior annular volume in the upper annular section of the inlet structure. The particles that are then dislodged from the interior wall surfaces of the upper annular section of the inlet structure then are directed to the overflow portion of the weir wall where such particulate solids are flushed to the downstream scrubber. The pressure, duration and periodicity of the high pressure gas pressure pulses can be easily set to accommodate the prevailing system particulate concentration conditions and character of such solids. The effectiveness of the pulsed high pressure gas injection will depend on the character of the particulate solids. The inlet structure of the present invention therefore is self-cleaning in nature, without the use of scraper or plunger devices typical of the so-called self-cleaning apparatus of prior art fluid treatment systems.

The material specification of the porous wall element of the upper annular section of the inlet structure is dependent on the incoming process gas from the upstream process unit. If the gas stream includes acid gas components, such gases will be absorbed in the water scrubber and will be present in water which is recirculated to the overflow weir wall in the lower annular section of the inlet structure. It is possible that some of the overflow weir wall water will splash up on the porous inner wall of the upper annular section of the inlet structure. The porous wall in such instance is desirably selected from corrosion-resistant materials of construction. A preferred metal material for such purpose is Hastelloy 276 steel, which exhibits excellent corrosion resistance under low temperature hydrous acid conditions.

Another advantage of the inlet structure of the present invention is that it minimizes the backflow of water vapor from the top of the water scrubber into the process piping when the inlet structure is employed upstream of a water scrubber as illustratively described herein. By way of explanation of this advantage, it is to be appreciated that particulates may be present in the exhaust streams of some semiconductor tools as either entrained particulates from the process tool, or as the reactants of a chemical reaction within the gas stream's flow path.

The present invention minimizes or eliminates the previously described Richarson annular effect. Due to the steady outflow of gas at the inner surface of the porous wall of the upper annular section of the inlet structure, the static boundary layer condition at the inner wall surface of the upper annular section cannot develop. There is a net flux of flowing gas from the gas-permeable wall which acts to "push" the process gas flow away from the wall bounding the central flow passage of the inlet structure, and avoids the presence of a static boundary condition, thereby avoiding the Richardson annular effect. Accordingly, if particles are formed as a result of chemical reaction in the flow stream, the thus-formed particles do not find a wall on which to agglomerate. The particles instead will flow with the gas stream into the water scrubber. The same is true for entrained particles. Once the particles reach the top of the inlet, they will become entrained in the gas flow stream because they will not have a wall on which to collect.

By opposing the conditions which give rise to the Richarson annular effect, the porous wall in the upper annular section of the inlet structure of the present invention serves as an effective barrier to the back migration of water vapor to the exhaust lines of the process system. Any back migration will be exceedingly slow due to the aforementioned interdiffusion mechanism. This factor will greatly increase the mean time to failure for the scrubber, since the scrubber entry and exhaust lines will not clog as often with the inlet structure of the present invention. When the delivery tube 70 is used, the backflow of water vapor is minimized or eliminated due to the annular gas blanket formed by the action of gas flowing through porous wall 6.

Although the porous wall member of the upper annular section of the inlet structure of the invention has been described herein as being constructed of a metal material, it will be appreciated that such gas-permeable wall may be formed of any suitable material of construction. For example, the porous wall may be formed of a porous ceramic, plastic (e.g., porous polyethylene, polypropylene, polytetrafluoroethylene, etc.), or other material having the capability to withstand the corrosive atmospheres, temperature extremes, and input pressures that may be present in the use of the inlet structure of the present invention.

While the invention has been described herein in the embodiment shown illustratively in FIG. 1 as comprising respective discrete upper and lower annular sections which are coupled to one another, as for example by flanges and associated quick-disconnect clamps or other interconnection means, it will be appreciated that such inlet structure may be formed as a unitary or integral structure, as may be desired or necessary in a given end use application of the present invention, and that the lower annular section is an optional section to the upper annular section, and may be unnecessary in some instances.

Figure 2:
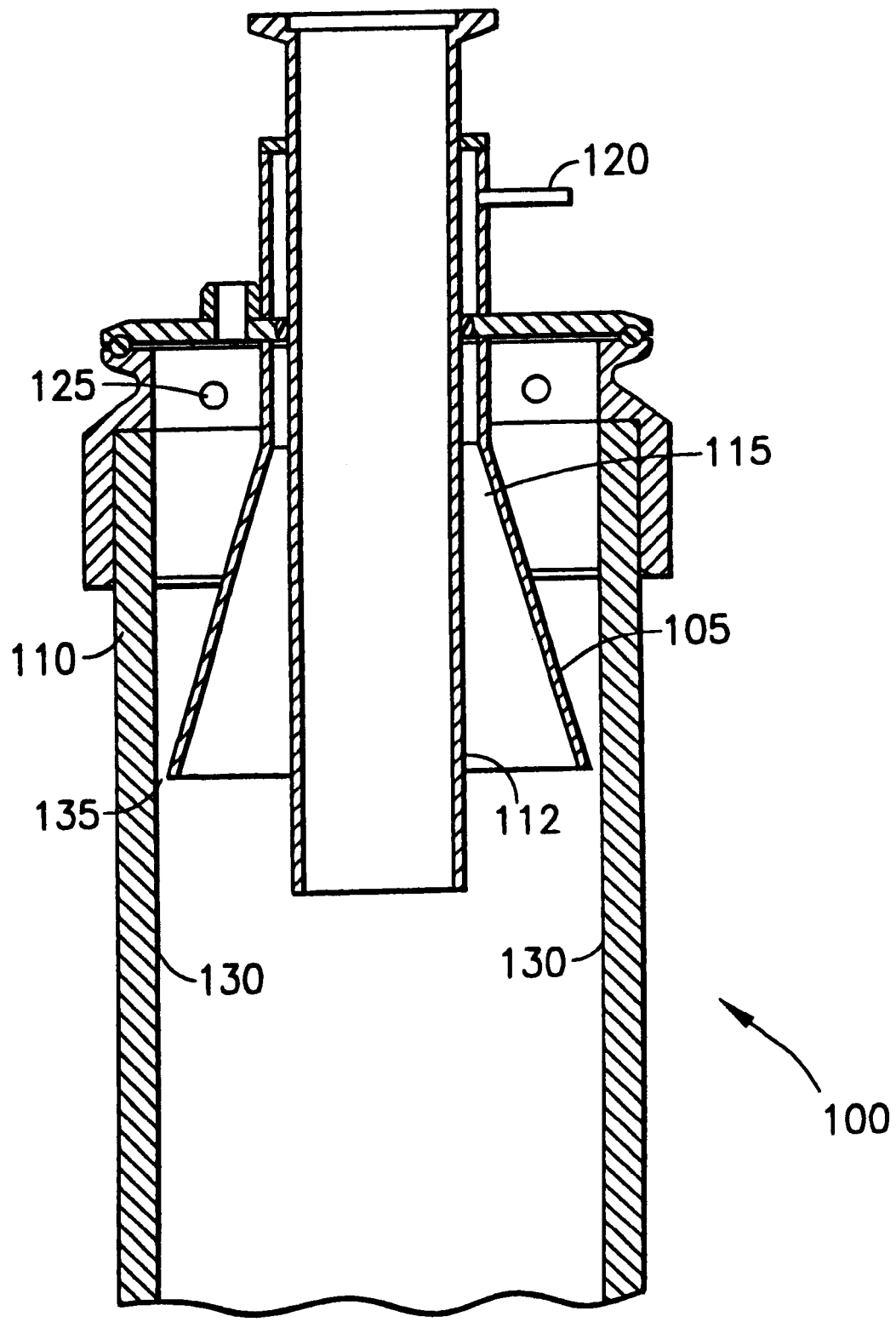
FIG. 2 is a schematic representation of a clogging-resistant inlet structure according to an alternative embodiment of the present invention.

Referring now to FIG. 2, another embodiment of a clogging-resistant inlet structure is shown. Inlet 100 may alternatively include conical skirt 105 circumscribed by solid outer wall 110. The exterior surface of delivery tube 112 and the interior surface of conical skirt 105 define therebetween an annular gas flow passage 115. The conical skirt annularly surrounds the particulate solids-containing and/or solids-forming gas stream with an inert gas and/or liquid. An inert gas enters the inlet structure through feed line 120. The downwardly and outwardly flaring conical skirt has a progressively decreasing cross-sectional area which causes the velocity of the inert gas to increase and the pressure to decrease. Conical skirt 105 is designed to produce an inert gas velocity equal to the velocity of the gas stream exhausting from delivery tube 112. The matching of flow velocities between the gas stream and the inert gas advantageously creates co-laminar flow to prevent turbulence in the gas stream and to prevent intermixing at an interface between the two flow streams. Efficiency of the inlet is, therefore, enhanced by minimizing the buildup of particulate solids during operation.

The downwardly and outwardly flaring conical skirt could also be used to advantageously introduce a liquid into the inlet structure. The outer wall 110 and the lower end (bottom periphery) of the conical skirt are in transversely spaced-apart relationship to one another to define a liquid flow passage 135 therebetween. Spray nozzles 125 could be circumferentially spaced apart in relation to each other within the inlet to disperse the liquid. The conical skirt directs the liquid toward wall surface 130. If the liquid is, for example, water, a thin film of water will be formed on wall surface 130 to flush particulate solids to the downstream scrubber. The material specification of the conical skirt is dependent on the inert gas and the gas stream flowing through delivery tube 112. If the gas stream includes acid gas components, such gases will be present in the water recirculated to spray nozzles 125. The conical skirt in such instance is desirably fabricated from corrosion-resistant materials. As discussed in reference to the FIG. 1 embodiment, the delivery tube, inert gas, and/or water may be heated to reduce condensation.

Figure 3:
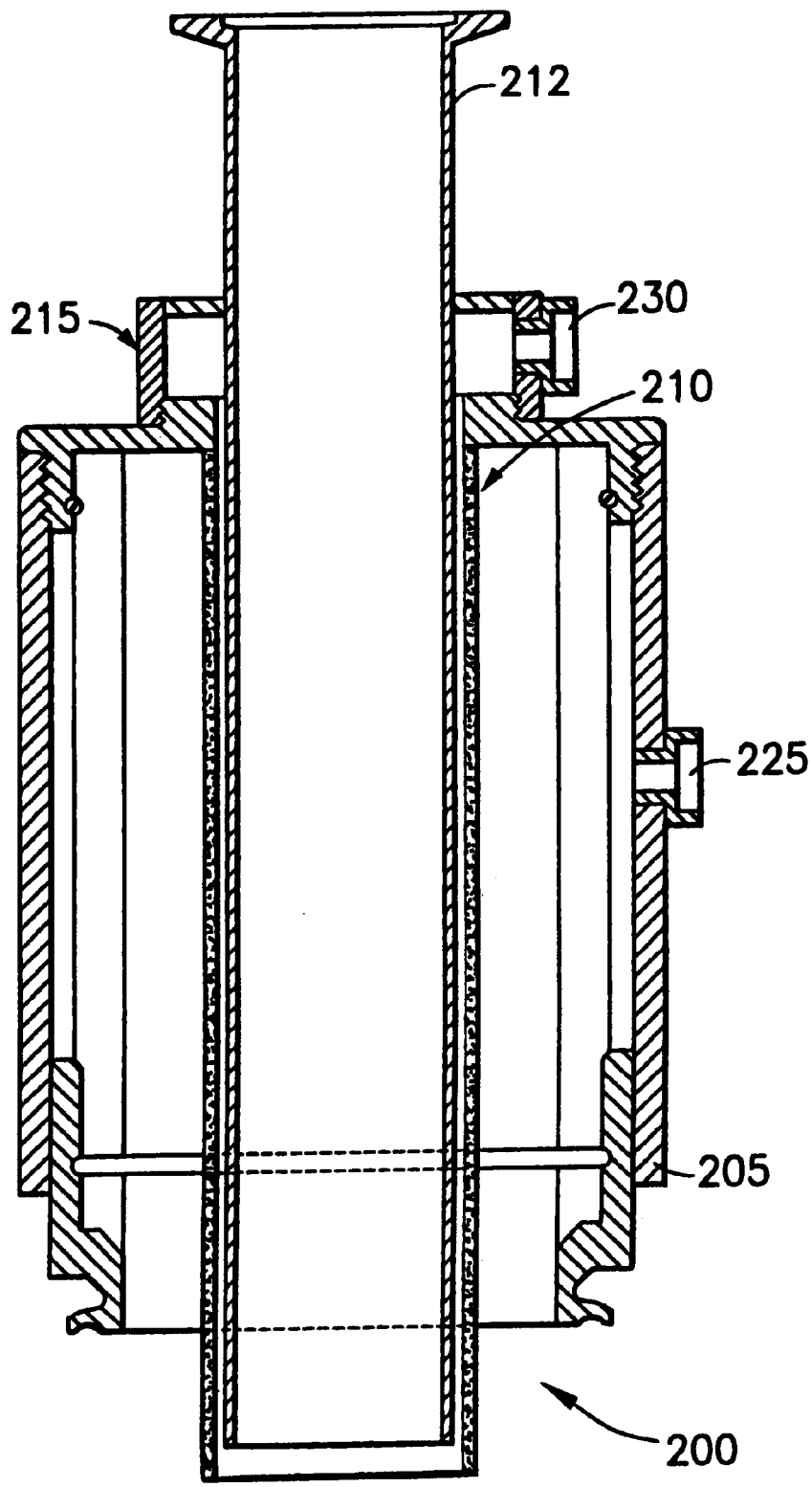
FIG. 3 is a schematic representation of a clogging-resistant inlet structure according to a further alternative embodiment of the present invention.

FIG. 3 illustrates another embodiment of a clogging-resistant inlet structure 200. Outer solid wall 205 and porous inner wall 210 define an annular interior volume therebetween. Extended gas stream delivery tube 212 may be used to introduce the particulate solids-containing and/or particulate solids-forming gas stream at a specific desired location of the inlet structure. Delivery tube 212 is coupled in gas-flow receiving relationship with an upstream source and directs and exhausts the gas stream to a suitable location within the inlet structure. The interior facing surface of inner porous wall 210 circumscribes the exterior facing surface of delivery tube 212. Outer wall 205 is enclosed at its upper end by end cap 215.

The outer wall is provided with a water inlet port 225 which may be joined to a water supply. End cap 215 is provided with a gas inlet port 230 to axially introduce a shrouding inert gas into the inlet structure. End cap 215 may alternatively include a porous disperser structure to axially disperse the inert gas into the inlet structure. A gas cavity or reservoir may optionally contain the inert gas, e.g., nitrogen, for introduction into the inlet. Water is extruded, in this embodiment, through porous inner wall 210 to form a thin liquid film to flush particulates through the inlet structure. Porous wall 210 may be formed of any suitable material, e.g., ceramic, metal, metal alloy, or a plastic such as polyvinylchloride. As discussed hereinabove, the delivery tube, inert gas, and/or water may be heated to reduce or eliminate condensation.

As a further alternative to the specific structure shown in FIG. 3, the porous inner wall 210 could be replaced with a weir of the type shown with reference to FIG. 1. A weir wall could, for example, be constructed having an upper end in spaced relation to upper end cap 215 so as to form a gap therebetween defining an overflow weir.

Figure 4:
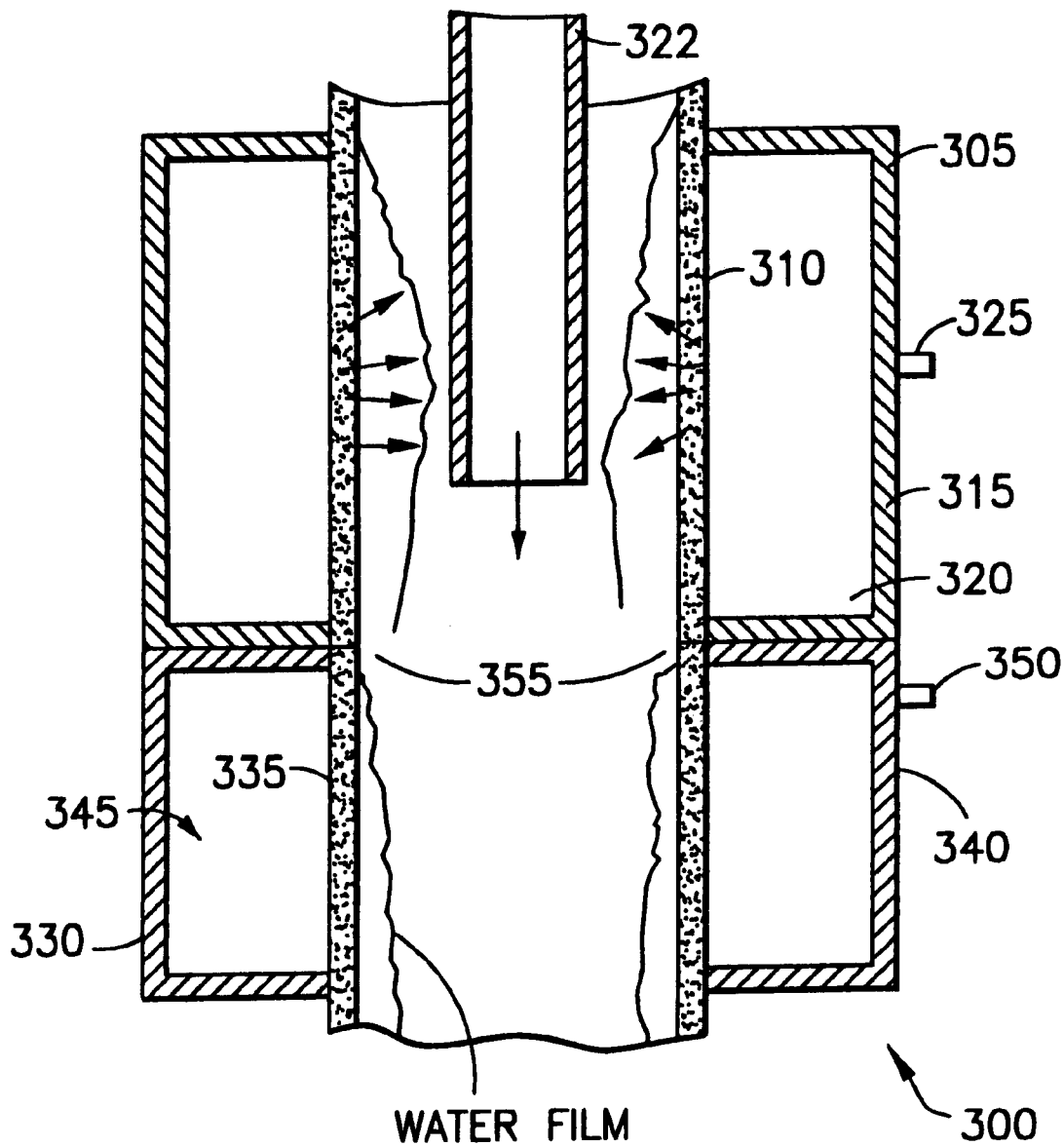
FIG. 4 is a schematic representation of a clogging-resistant inlet structure according to a further alternative embodiment of the present invention.

FIG. 4 shows another embodiment of a clogging-resistant inlet structure 300. The upper annular section 305 includes upper inner porous wall 310 and outer upper solid wall 315, defining an upper annular interior chamber 320 therebetween. Extended gas stream delivery tube 322 is circumscribed by upper porous wall 310 and is shown as being positioned coaxially with respect to porous wall 310. An exterior surface of the gas delivery tube and interior surface of upper porous wall define an annular volume therebetween. Delivery tube 322 is coupled in gas flow receiving relationship with an upstream gas source. Upper solid wall 315 includes an inlet port 325 to introduce a suitable fluid into the upper interior chamber 320.

Lower annular section 330 includes lower inner porous wall 335 and outer lower solid wall 340 defining a lower annular interior chamber 345 therebetween. Lower solid wall includes an inlet port 350 to introduce a fluid into lower chamber 345. In operation, the inlet structure of FIG. 4 allows inert gas to permeate through upper porous wall 310 and water to extrude through lower porous wall 335. The flow of inert gas keeps the particulates in the gas stream away from the interior wall surfaces of the inlet structure. The thin film of water on the interior surface of lower inner porous wall 335 washes any particulates from the inlet structure.

FIG. 4 shows delivery tube 322 exhausting the gas stream above a transition region 355 between the upper section 305 and lower section 330. Transition region 355 may be a region abuttingly joining upper annular section 305 and lower annular section 330. Transition region 355 may also include a region separating upper section 305 from lower section 330 and circumscribing gas delivery tube 322. It is to be understood that the delivery tube may alternatively extend below transition region 355 and into the lower section. Whether delivery tube 322 exhausts the gas stream within the upper section, exhausts within the transition region, or exhausts within the lower section will depend upon the gas stream, process use, and conditions. As discussed hereinabove, the delivery tube, inert gas, and/or water may be heated to reduce or eliminate condensation.

Thus, while the invention has been described herein with reference to specific variations, modifications and embodiments of the invention, it will be appreciated that the invention is not thus limited but extends to variations, modifications and embodiments other than those specifically disclosed, and the invention is therefore to be broadly construed and interpreted as encompassing all such variations, modifications and other embodiments, within its spirit and scope.

What is claimed is:

1. A clog-resistant inlet structure for introducing a gas stream to a gas processing system, said inlet structure comprising:
    a wall enclosing a gas flow path, including an upper wall section enclosing an upper section of the gas flow path, and a lower wall section enclosing a lower section of the gas flow path;
    a gas delivery tube arranged to receive the gas stream for flow therethrough, said gas delivery tube (i) being positioned within the gas flow path, (ii) extending axially into and through at least a portion of the upper section of the gas flow path enclosed by the upper wall section, and (iii) terminating in the gas flow path at an outlet end that is arranged to discharge a laminar flow of the gas stream into the lower section of the gas flow path; and
    means for introducing a shrouding gas in the upper section of the gas flow path, for flow of the shrouding gas from the upper section of the gas flow path to the lower section of the gas flow path in co-annular laminar flow to the gas stream flowing through the gas delivery tube and discharged at the outlet end thereof into the lower section of the gas flow path, so that a laminar axial flow of the shrouding gas shrouds the laminar flow of the gas stream discharged from the gas delivery tube.

2. An inlet structure according to claim 1, wherein the wall is constructed and arranged with a liquid supply in feed relationship thereto, to provide a falling film of liquid on a surface of the wall, so as to avoid contact of the gas stream with the wall.

3. An inlet structure according to claim 1, wherein the gas delivery tube is arranged to receive the gas stream from a semiconductor manufacturing tool.

4. An inlet structure according to claim 1, wherein the lower section of the gas flow path is coupled in gas flow relationship with a water scrubber unit.

5. An inlet structure according to claim 3, wherein the lower section of the gas flow path is coupled in gas flow relationship with a combustion scrubber unit.

6. An inlet structure according to claim 1, further comprising means for heating the gas delivery tube to combat condensation of condensable components in the gas stream when flowed therethrough.

7. An inlet structure according to claim 1, wherein the gas delivery tube terminates in the gas flow path at an outlet end that is positioned in the lower section of the gas flow path.

8. An inlet structure according to claim 1, wherein the upper wall section comprises a gas-permeable wall arranged to receive the shrouding gas from a source thereof, for flow of the shrouding gas through the gas-permeable wall.

9. An inlet structure according to claim 1, wherein the gas-permeable wall is formed of a porous metal.

10. An inlet structure according to claim 1, wherein the gas-permeable wall is formed of a porous ceramic.

11. An inlet structure according to claim 1, wherein the gas-permeable wall is formed of a porous plastic.

12. An inlet structure according to claim 1, wherein the gas-permeable wall is of circular cross-section.

13. An inlet structure according to claim 2, wherein the surface of the wall with a falling film of liquid thereon, comprises the lower wall section.

14. An inlet structure according to claim 13, wherein the lower wall section comprises a porous wall surface.

15. An inlet structure according to claim 13, wherein the lower wall section includes a wall portion defining a liquid overflow weir.

16. An inlet structure according to claim 15, wherein the liquid overflow weir is joined in feed relationship to said liquid supply.

17. An inlet structure according to claim 1, wherein the upper wall section and lower wall section are each of cylindrical shape.

18. An inlet structure according to claim 1, wherein the upper wall section and lower wall section have a same diameter.

19. An inlet structure according to claim 1, wherein the upper wall section, gas delivery tube and lower wall section are vertically aligned and coaxial with respect to one another.

* * * * *

UNITED STATES PATENT AND TRADEMARK OFFICE
CERTIFICATE OF CORRECTION

PATENT NO : 5,935,283
DATED : August 10, 1999
INVENTOR(S) : Sweeney et al.

It is certified that error appears in the above-identified patent and that said Letters Patent is hereby corrected as shown below:

Column 3, line 12: "SUMMARY OF THE INVETION" should be --SUMMARY OF THE INVENTION--

Column 9, line 43: "in let" should be --inlet--

Signed and Sealed this

Fourth Day of April, 2000

Attest:

Q. TODD DICKINSON

Attesting Officer

Director of Patents and Trademarks